(12) United States Patent
Funahashi et al.

(10) Patent No.: US 8,462,306 B2
(45) Date of Patent: Jun. 11, 2013

(54) DISPLAY DEVICE

(75) Inventors: Yuta Funahashi, Himeji (JP); Tetsuya Kawamura, Himeji (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 249 days.

(21) Appl. No.: 12/781,034

(22) Filed: May 17, 2010

(65) Prior Publication Data

US 2010/0294541 A1    Nov. 25, 2010

(30) Foreign Application Priority Data

May 25, 2009    (JP) ................... 2009-124995

(51) Int. Cl.
*G02F 1/1333*    (2006.01)
*G02F 1/1345*    (2006.01)

(52) U.S. Cl.
USPC .......................................... 349/149; 349/138

(58) Field of Classification Search
USPC ................................................ 349/138, 149
See application file for complete search history.

(56) References Cited

U.S. PATENT DOCUMENTS

| | | | |
|---|---|---|---|
| 5,995,178 A | 11/1999 | Fujikawa et al. | |
| 6,958,802 B2 | 10/2005 | Watamura | |
| 7,256,852 B2 | 8/2007 | Ono et al. | |
| 2006/0232739 A1* | 10/2006 | Yeo et al. | 349/149 |
| 2007/0008263 A1 | 1/2007 | Kim | |
| 2008/0007683 A1* | 1/2008 | Makida | 349/139 |

FOREIGN PATENT DOCUMENTS

| | | |
|---|---|---|
| JP | 06-294975 | 10/1994 |
| JP | 09-113930 | 5/1997 |
| JP | 2004-054069 | 2/2004 |
| JP | 2005-077424 | 3/2005 |
| JP | 2006-309239 | 11/2006 |

* cited by examiner

*Primary Examiner* — Mark Robinson
*Assistant Examiner* — Jerry Blevins
(74) *Attorney, Agent, or Firm* — Antonelli, Terry, Stout & Kraus, LLP.

(57) ABSTRACT

A display device includes: a first line and a second line which are arranged adjacent to and parallel to each other in a spaced-apart manner; a conductive layer which is arranged at a position where the conductive layer overlaps with the first line and the second line; and an insulation layer which is interposed between the first and second lines and the conducive layer. Here, the conductive layer includes a first overlapping portion which overlaps with the first line, a second overlapping portion which overlaps with the second line, and a connecting portion which connects the first overlapping portion and the second overlapping portion between the first overlapping portion and the second overlapping portion.

5 Claims, 12 Drawing Sheets

DISPLAY DEVICE

CROSS-REFERENCE TO RELATED APPLICATION

The present application claims priority from Japanese application JP2009-124995 filed on May 25, 2009, the content of which is hereby incorporated by reference into this application.

BACKGROUND OF THE INVENTION

1. Field of the Invention

The present invention relates to a display device.

2. Description of the Related Art

A display device includes a large number of lines. Since it is difficult to form these lines without disconnection, each time the disconnection occurs, the disconnection is repaired. As a method for repairing a disconnected line, there has been known a technique where a conductive layer is arranged below a line, and when the line is disconnected, the line is bonded to the conductive layer using laser beams (see JP-A-2004-54069 (related U.S. Pat. No. 6,958,802) and JP-A-9-113930 (related U.S. Pat. No. 5,995,178)).

It is possible to repair the disconnection of the line in wiring by the above-mentioned method. However, when a foreign substance lies on a line, in an attempt to remove the foreign substance using laser beams, there has been a case where not only the foreign substance but also the line and the conductive layer which is arranged below the line is removed so that the line is disconnected and the repair is also not possible.

Further, recently, particularly in a liquid crystal display device used in a television receiver set or the like, development of pixels having higher definition has been in progress. In pixels which satisfy the higher definition, one pixel is divided into two sub pixels, for example, and a switching element and a drain signal line which supplies a video signal to the switching element are formed in each sub pixel. That is, there is a case where lines (drain signal lines) between the pixels are formed in duplicate (see JP-A-2005-77424 (related U.S. Pat. No. 7,256,852) and JP-A-2006-309239 (related US Patent Publication No. 2007/0008263)). In the liquid crystal display device having such structure, a distance between the lines is narrow and hence, when a defect such as disconnection occurs, the repair of the line becomes extremely difficult.

SUMMARY OF THE INVENTION

It is an object of the present invention to provide the structure which can repair the disconnection of a line in wiring, and more particularly to the structure where a plurality of lines are formed between pixels and the line can be repaired easily.

(1) According to one aspect of the present invention, there is provided a display device which includes: a first line and a second line which are arranged adjacent to and parallel to each other in a spaced-apart manner; a conductive layer which is arranged at a position where the conductive layer overlaps with the first line and the second line; and an insulation layer which is interposed between the first and second lines and the conducive layer, wherein the conductive layer includes a first overlapping portion which overlaps with the first line, a second overlapping portion which overlaps with the second line, and a connecting portion which is arranged between the first overlapping portion and the second overlapping portion and connects the first overlapping portion and the second overlapping portion.

According to the present invention, it is possible to repair the disconnection of the first line or the second line by connecting the first line or the second line to the conductive layer. Further, even when the first overlapping portion or the second overlapping portion of the conductive layer is disconnected due to the removal of a foreign material, the electrical connection is maintained by the connecting portion and hence, it is possible to repair the disconnection of the first line or the second line.

(2) In the display device having the constitution (1), the connecting portion may include a first connecting portion and a second connecting portion which are arranged in a spaced-apart manner from each other, and the conductive layer may include a slit in a region surrounded by the first overlapping portion, the second overlapping portion, the first connecting portion and the second connecting portion.

(3) In the display device having the constitution (1), the first overlapping portion may include a pair of first portions which is arranged in a spaced-apart manner from each other, the second overlapping portion may include a pair of second portions which is arranged in a spaced-apart manner from each other, the conductive layer may be formed in a state where the overlapping of the conductive layer with both of the first line and the second line is avoided between the pair of first portions and between the pair of second portions, one first portion and one second portion may be arranged adjacent to each other, and another first portion and another second portion may be arranged adjacent to each other, and the connecting portion may include a first connecting portion which extends between one first portion and one second portion arranged adjacent to each other, a second connecting portion which extends between another first portion and another second portion arranged adjacent to each other, and a third connecting portion which extends between the first connecting portion and the second connecting portion.

(4) In the display device having the constitution (3), the first line may include a first side portion which includes a side opposite to the second line and extends continuously, the second line may include a second side portion which includes a side opposite to the first line and extends continuously, the pair of first portions may be arranged in a state where the overlapping of the first portions with the first side portion is avoided, and the pair of second portions may be arranged in a state where the overlapping of the second portions with the second side portion is avoided.

(5) In the display device having the constitution (4), the first line may include a pair of first large-width portions which is formed in a projecting manner in the direction opposite to the second line, the second line may include a pair of second large-width portions which is formed in a projecting manner in the direction opposite to the first line, the pair of first portions may overlap with portions of the pair of first large-width portions on a second line side, and the pair of second portions may overlap with portions of the pair of second large-width portions on a first line side.

(6) In the display device having the constitution (4) or (5), the third connecting portion may be made of a light transmitting material.

(7) In the display device having any one of the constitutions (1) or (6), the display device may further include a plurality of pixel electrodes, and the first line and the second line may be arranged between the pixel electrodes arranged adjacent to each other, and may be electrically connected with either one of the pixel electrodes.

DETAILED DESCRIPTION OF THE INVENTION

Hereinafter, embodiments of the present invention are explained in conjunction with drawings.

First Embodiment

Figure 1:
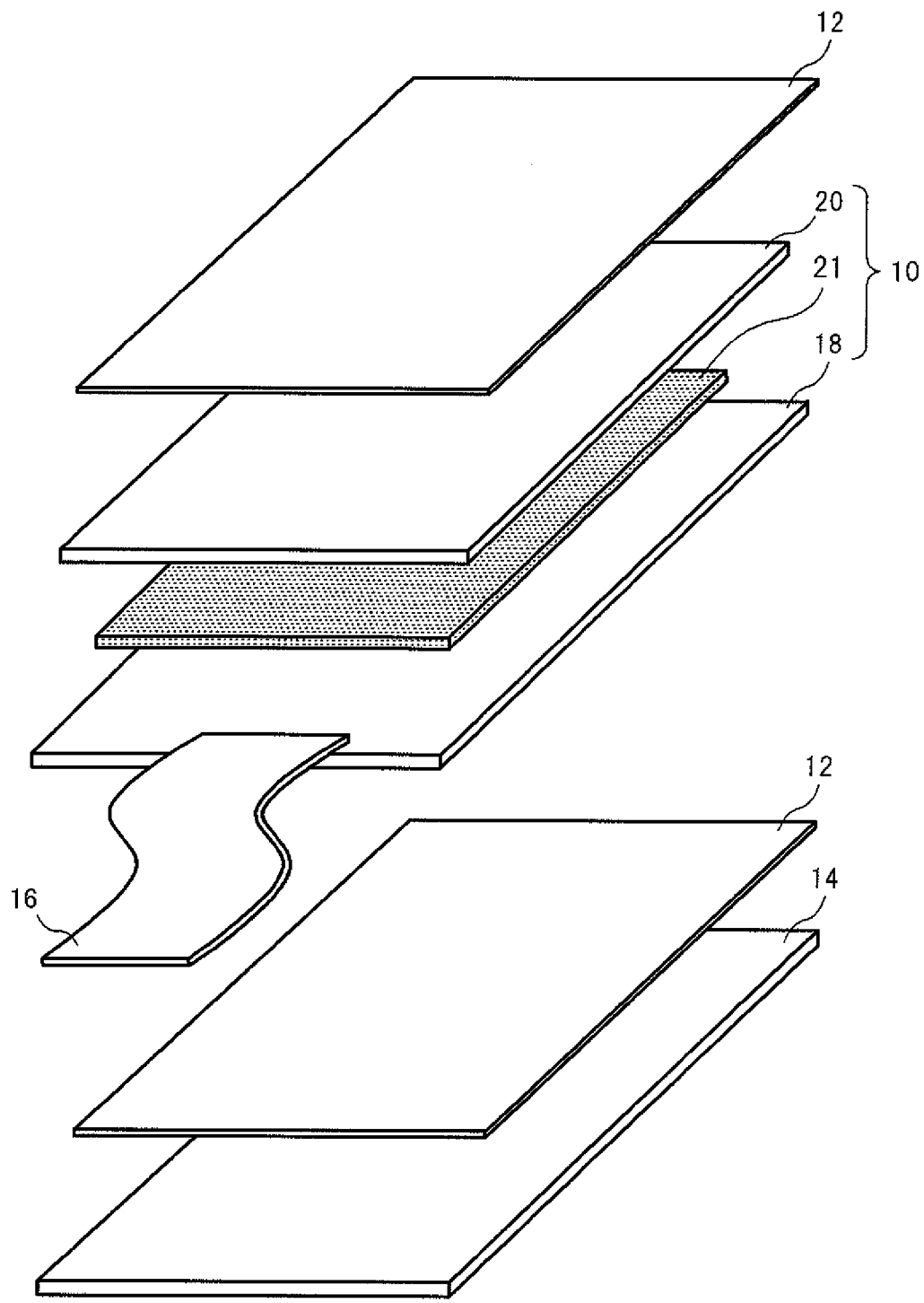
FIG. 1 is an exploded perspective view showing a display device according to a first embodiment of the present invention.

FIG. 1 is an exploded perspective view showing a display device according to a first embodiment of the present invention. The explanation of the display device is made hereinafter by taking a liquid crystal display device as an example. The liquid crystal display device includes a liquid crystal panel 10. A polarizer 12 is arranged on both surfaces of the liquid crystal panel 10 respectively. The liquid crystal display device includes a backlight 14. One polarizer 12 is interposed between the liquid crystal panel 10 and the backlight 14. A flexible printed circuit board 16 is mounted on the liquid crystal panel 10.

The liquid crystal panel 10 includes a substrate 18 and a counter substrate 20 which faces the substrate 18 in an opposed manner, and liquid crystal 21 is interposed between both substrates. The substrate 18 is a TFT (Thin Film Transistor) substrate (or an array substrate) which includes thin-film field effect transistors, pixel electrodes, lines and the like. The counter substrate 20 is a color filter substrate.

As a driving method of the liquid crystal panel 10, an IPS (In Plane Switching) method is assumed in this embodiment. However, the driving method is not limited to the IPS method. That is, another method such as a TN (Twisted Nematic) method or a VA (Vertical Alignment) method may be adopted. Electrodes and lines corresponding to a selected driving method are formed. The display device is not limited to the liquid crystal display device and may be an electroluminescence display device.

Figure 2:
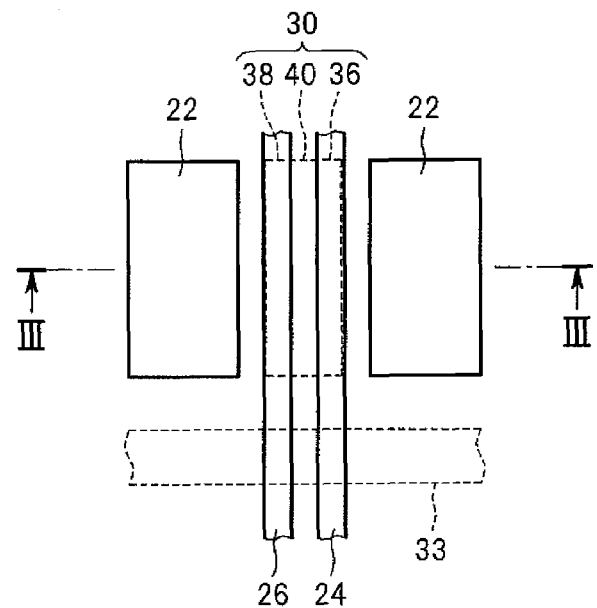
FIG. 2 is a plan view showing a portion of the display device according to the first embodiment in an enlarged manner.
Figure 3:
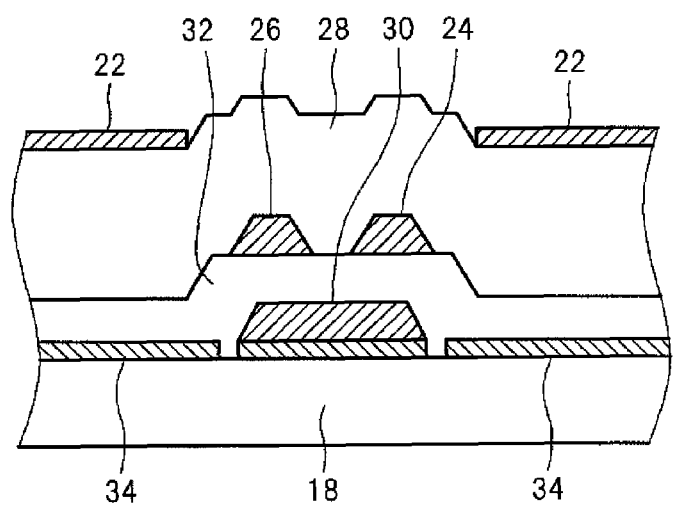
FIG. 3 is an enlarged cross-sectional view of the display device shown in FIG. 2 taken along a line III-III.

FIG. 2 is a plan view showing a portion of the display device according to the first embodiment in an enlarged manner. FIG. 3 is an enlarged cross-sectional view of the display device shown in FIG. 2 taken along a line III-III.

The display device includes a plurality of pixel electrodes 22. The pixel electrode 22 is formed of a transparent conductive film made of ITO (Indium Tin Oxide) or the like.

The display device includes a first line 24 and a second line 26 which are arranged adjacent to and parallel to each other in a spaced-apart manner. Here, both a first line 24 and a second line 26 are drain signal lines which supply a video signal to the pixel electrodes 22 via thin film transistors not shown in the drawing which constitute switching elements. A passivation film 28 made of SiN, $SiO_2$ or the like is interposed between the first and second lines 24, 26 and the pixel electrodes 22. The first line 24 and the second line 26 are formed so as to extend between the pixel electrodes 22 arranged adjacent to each other. The first line 24 and the second line 26 respectively constitute signal lines for supplying an image signal to the pixel electrodes 22. The first line 24 and the second line 26 are respectively electrically connected to either one of the pixel electrodes 22 at portions not shown in the drawing. Such an electrical connection is established via through holes (not shown in the drawing) formed in the passivation film 28.

A conductive layer 30 is arranged at a position where the conductive layer 30 overlaps (stereoscopically intersects) with the first line 24 and the second line 26. The conductive layer 30 is electrically connected with neither the first line 24 nor the second line 26 and not connected with another line, and is in an electrically floating state. An insulation layer 32 made of SiN, $SiO_2$ or the like is interposed between the first and second lines 24, 26 and the conductive layer 30. The insulation layer 32 is a gate insulation film which covers gate signal lines 33 (see FIG. 2) provided for controlling thin film transistors not shown in the drawing.

The conductor layer 30 is constituted of a plurality of layers. One layer out of the plurality of layers is made of the same material as a common electrode 34 and at the same layer position as the common electrode 34. Such constitution is brought about by a process by which the conductive layers 30 and the common electrodes 34 are formed simultaneously. In the IPS (In Plane Switching) method, a voltage is applied between the common electrode 34 and the pixel electrode 22 so as to generate an electric field on the substrate 18 in the lateral direction thus driving the liquid crystal 21 (see FIG. 1) arranged above the pixel electrode 22. In this embodiment, the common electrodes 34 and the conductive layers 30 are directly formed on the substrate 18 made of glass.

As shown in FIG. 2, the conductive layer 30 includes a first overlapping portion 36 which overlaps with the first line 24 and a second overlapping portion 38 which overlaps with the second line 26. The conductive layer 30 includes a connecting portion 40 which is arranged between the first overlapping portion 36 and the second overlapping portion 38 and connects the first overlapping portion 36 and the second overlapping portion 38 to each other. The first overlapping portion 36, the second overlapping portion 38 and the connecting portion 40 are continuously and integrally formed with each other.

According to this embodiment, by electrically connecting the first line 24 or the second line 26 to the conductive layer 30, it is possible to repair the disconnection of the first line 24 or the second line 26. Further, even when the first overlapping portion 36 or the second overlapping portion 38 of the conductive layer 30 is disconnected due to the removal of a foreign material, the electrical connection is maintained by the connecting portion 40 and hence, it is possible to repair the disconnection of the first line 24 or the second line 26.

Figure 4:
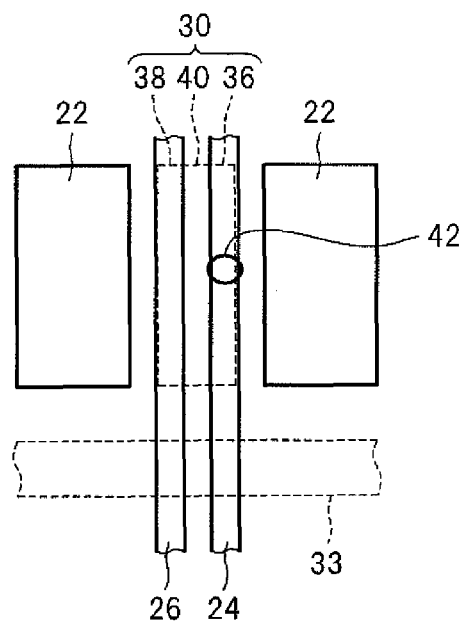
FIG. 4 is a view for explaining a method of repairing the disconnection of a line in the display device according to the first embodiment.
Figure 5:
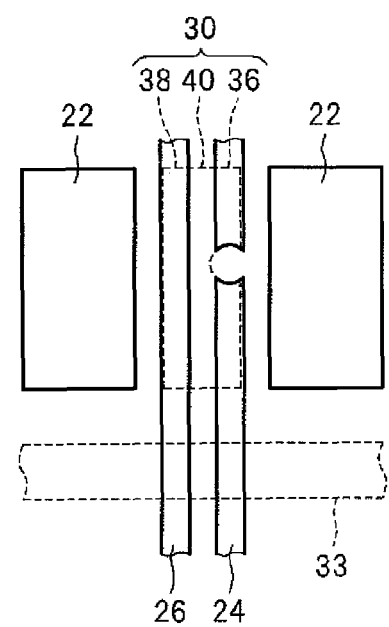
FIG. 5 is a view for explaining the method of repairing the disconnection of the line in the display device according to the first embodiment.
Figure 6:
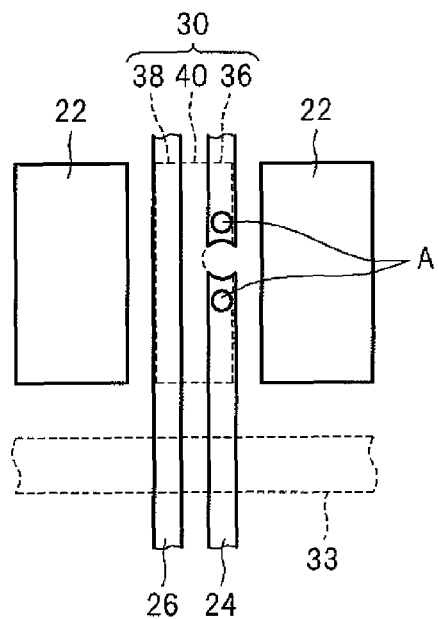
FIG. 6 is a view for explaining the method of repairing the disconnection of the line in the display device according to the first embodiment.

FIG. 4 to FIG. 6 are views for explaining a method of repairing the disconnection of the line in the display device according to the first embodiment.

As shown in FIG. 4, when a foreign material 42 lies on the first line 24, the foreign material 42 is removed by using a laser as shown in FIG. 5. Here, a laser beam is set to intensity sufficiently large for surely removing the foreign material 42 and hence, along with the removal of the foreign material 42, the first line 24 is disconnected and a hole is also formed in the conductive layer 30. However, portions of the first line 24 which sandwich a disconnecting portion therebetween overlap with the first overlapping portion 36 of the conductive layer 30.

As shown in FIG. 6, portions A of the first line 24 which sandwich the disconnecting portion therebetween are electrically connected with the first overlapping portion 36 of the conductive layer 30. The laser can be used also for such an electrical connection. The laser beam melts and penetrates the first line 24, forms a through hole also in the insulation layer 32, and also melts the first overlapping portion 36 so that a molten material of the first line 24 and the first overlapping portion 36 flows into the inside of the through hole formed in the insulation layer 32.

Due to such an operation, both portions A of the first line 24 which sandwich the disconnecting portion therebetween are respectively electrically connected with the first overlapping portion 36, and are made conductive with each other via the connecting portion 40 and the second overlapping portion 38. Accordingly, it is possible to repair the disconnection of the first line 24.

Figure 7:
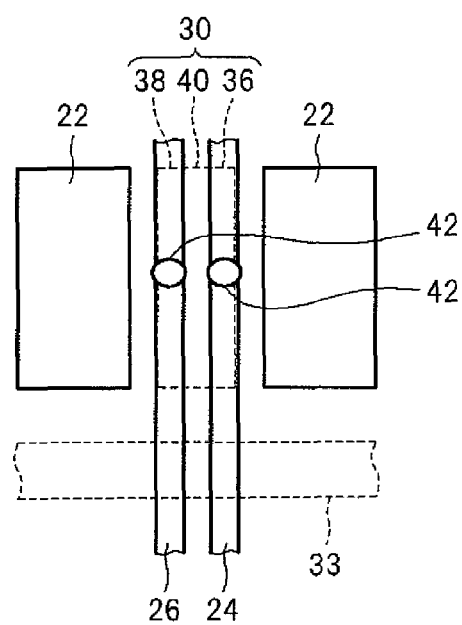
FIG. 7 is a view for explaining another method of repairing the disconnection of a line in the display device according to the first embodiment.
Figure 8:
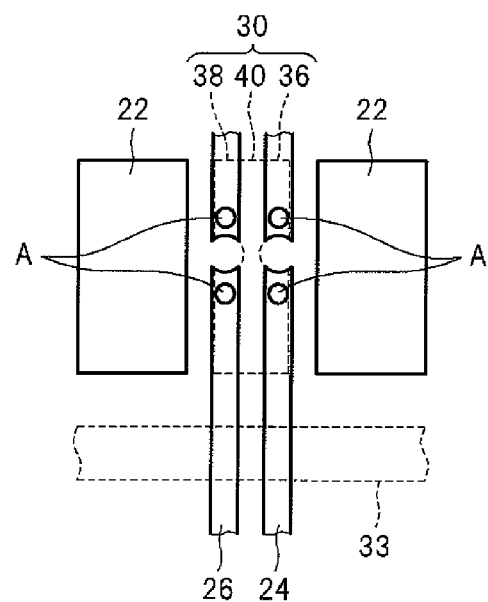
FIG. 8 is a view for explaining another method of repairing the disconnection of the line in the display device according to the first embodiment.
Figure 9:
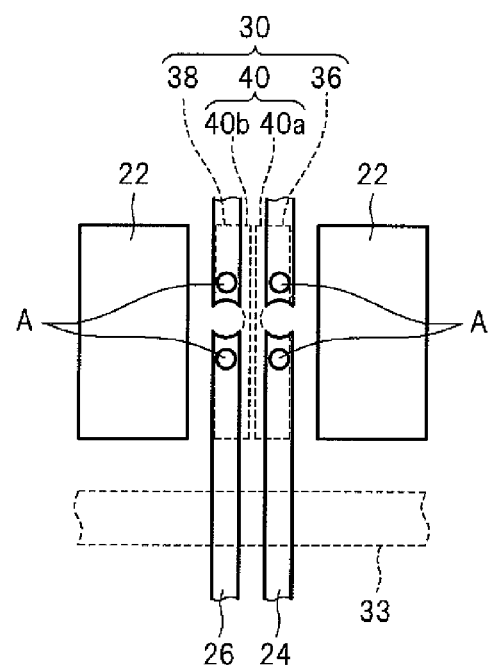
FIG. 9 is a view for explaining another method of repairing the disconnection of the line in the display device according to the first embodiment.

FIG. 7 to FIG. 9 are views for explaining another method of repairing the disconnection of the line in the display device according to the first embodiment.

As shown in FIG. 7, even when the foreign material 42 lies on both the first line 24 and the second line 26 respectively, these foreign materials 42 are removed by using a laser as shown in FIG. 8. Further, portions A of the first line 24 or the second line 26 which sandwich a disconnecting portion are electrically connected with the first overlapping portion 36 or the second overlapping portion 38 of the conductive layer 30.

The detail of this electrical connection is exactly equal to the detail of the electrical connection described above. In this example, both the first line 24 and the second line 26 are electrically connected with the conductive layer 30.

Further, as shown in FIG. 9, the connecting portion 40 of the conductive layer 30 is cut into a portion 40a on a first-overlapping-portion 36 side and a portion 40b on a second-overlapping-portion-38 side. A laser can also be used in such cutting. Due to such cutting, the electrical conduction between the first line 24 and the second line 26 can be cut thus repairing the disconnections of the first line 24 and the second line 26.

Second Embodiment

Figure 10:
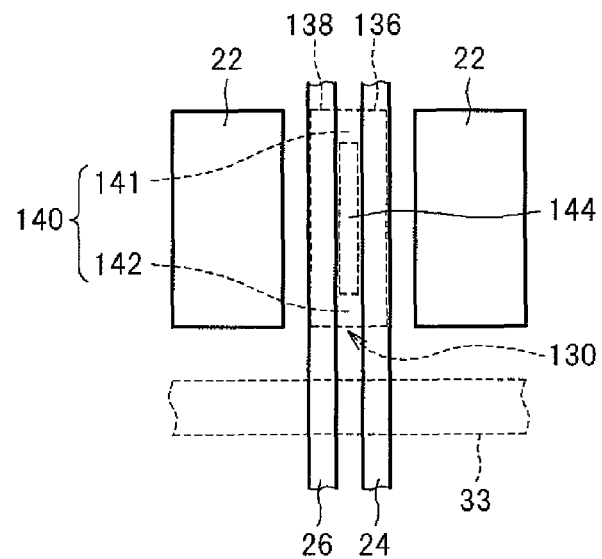
FIG. 10 is a plan view showing a portion of a display device according to a second embodiment in an enlarged manner.

FIG. 10 is a plan view showing a portion of the display device according to a second embodiment in an enlarged manner.

In this embodiment, a connecting portion 140 of a conductive layer 130 includes a first connecting portion 141 and a second connecting portion 142 which are arranged in a spaced-apart manner from each other. Further, the conductive layer 130 includes a slit 144 in a region which is surrounded by a first overlapping portion 136, a second overlapping portion 138, the first connecting portion 141 and the second connecting portion 142. In other words, the conductive layer 130 has a blanked square shape. Other constitutions of this embodiment correspond to the corresponding constitutions explained in conjunction with the first embodiment.

Figure 11:
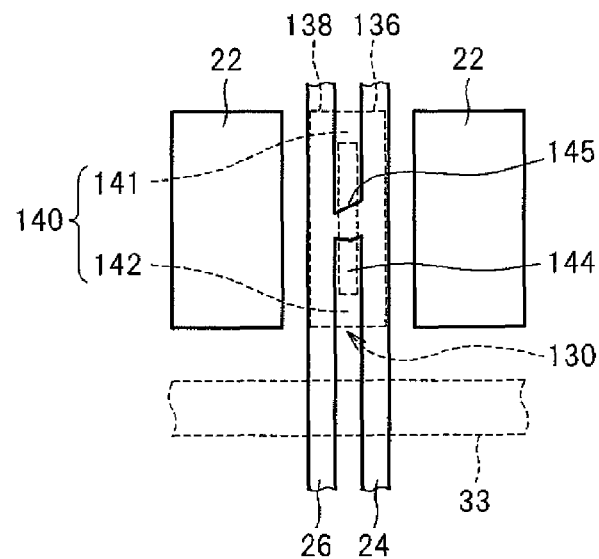
FIG. 11 is a plan view showing a portion of a display device according to the second embodiment in an enlarged manner.

According to this embodiment, the slit 144 formed in the conductive layer 130 is arranged between a first line 24 and a second line 26. Accordingly, even when the first line 24, the second line 26 and the conductive layer 130 are made of the same material and surfaces of these lines and layer have the same light reflectance, the region where the slit 144 is formed has the different light reflectance. Due to such a constitution, as show in FIG. 11, even when the first line 24 and the second line 26 are short-circuited due to an etching defect or the like, a surface of a short-circuited portion 145 and a surface in the region where the slit 144 is formed differ from each other in light reflectance and hence, it is possible to easily and visually recognize the short-circuiting.

Figure 12:
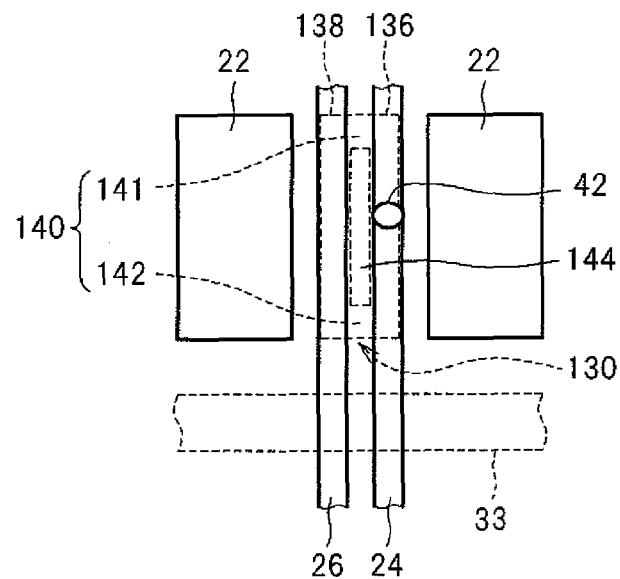
FIG. 12 is a view for explaining a method of repairing the disconnection of a line in the display device according to the second embodiment.
Figure 13:
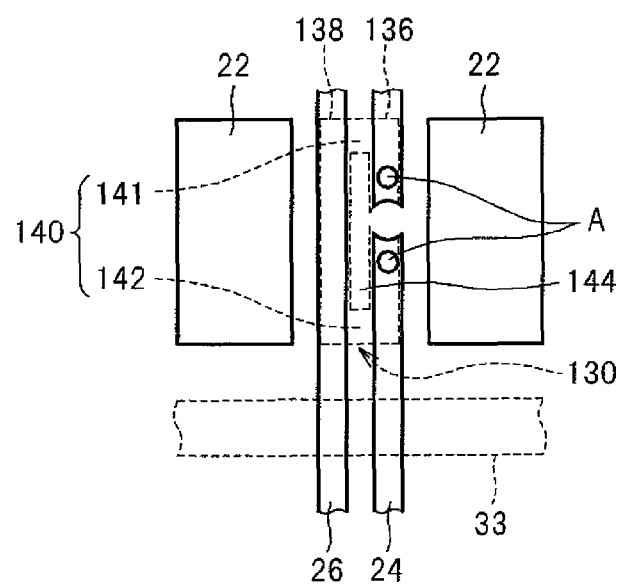
FIG. 13 is a view for explaining the method of repairing the disconnection of the line in the display device according to the second embodiment.

FIG. 12 and FIG. 13 are views for explaining a method of repairing the disconnection of a line in the display device according to the second embodiment.

As shown in FIG. 12, when a foreign material 42 lies on the first line 24, the foreign material 42 is removed by using a laser as shown in FIG. 13. Further, portions A which sandwich a disconnecting portion therebetween are respectively electrically connected with the first overlapping portion 136 of the conductive layer 130. The detailed constitution of this embodiment is exactly equal to the corresponding constitution explained in conjunction with the first embodiment.

Figure 14:
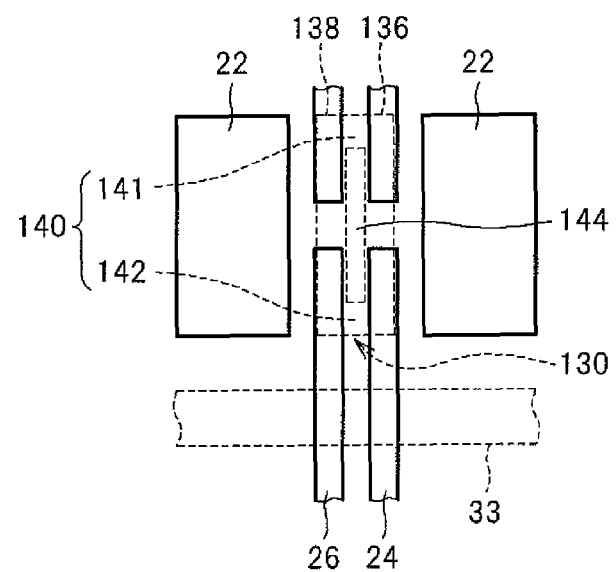
FIG. 14 is a view for explaining another method of repairing the disconnection of a line in the display device according to the second embodiment.
Figure 15:
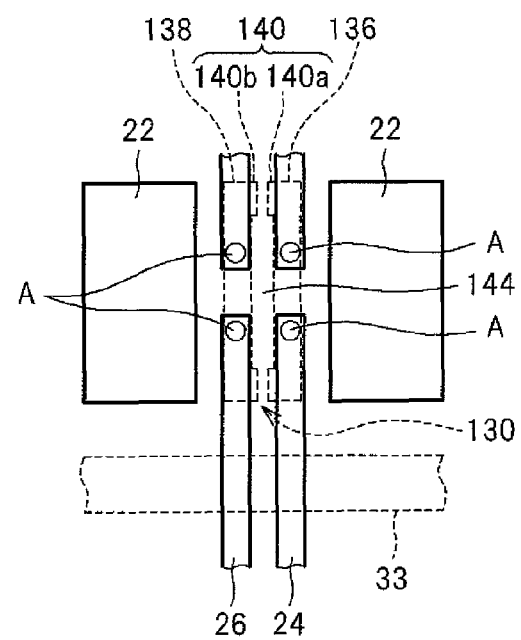
FIG. 15 is a view for explaining another method of repairing the disconnection of a line in the display device according to the second embodiment.

FIG. 14 and FIG. 15 are views for explaining another method of repairing the disconnection of a line in the display device according to the second embodiment.

FIG. 14 shows an example in which both the first line 24 and the second line 26 are disconnected. For example, such the disconnection may occur when etching is defective or when a foreign material 42 which lies on the first line 24 and the second line 26 is removed using a laser beam.

In this case, as shown in FIG. 15, with respect to each of the first line 24 and the second line 26, portions A which sandwich a disconnecting portion therebetween are electrically connected with the first overlapping portion 136 or the second overlapping portion 138 of the conductive layer 130. The detail of this electrical connection is exactly equal to the detail of the electrical connection described above. Then, the connection potion 140 of the conductive layer 130 is cut into a portion 140a on a first-overlapping-portion-136 side and a portion 140b on a second-overlapping-portion-138 side. A laser can also be used in such cutting. Accordingly, it is possible to cut the electrical connection between the first line 24 and the second line 26. In this manner, it is possible to repair the disconnection of the first line 24 and the second line 26.

Third Embodiment

Figure 16:
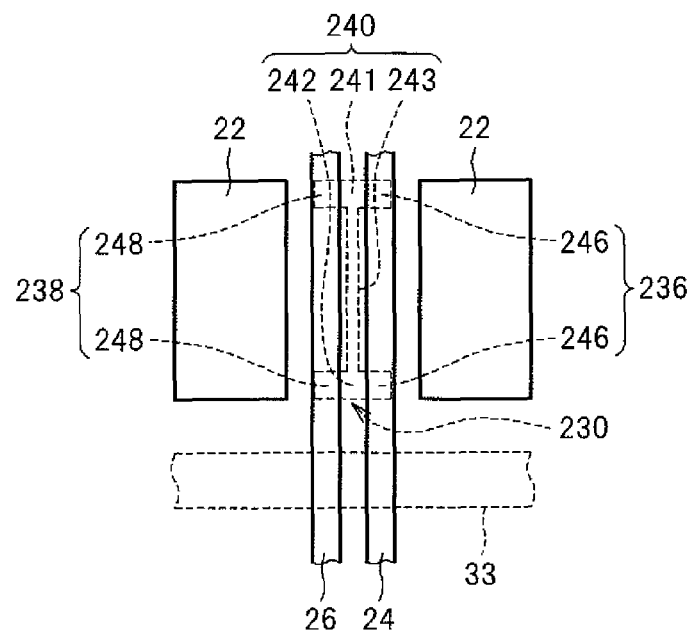
FIG. 16 is a plan view showing a portion of a display device according to a third embodiment in an enlarged manner.

FIG. 16 is a plan view showing a portion of a display device according to a third embodiment in an enlarged manner.

In this embodiment, a first overlapping portion 236 of a conductive layer 230 which overlaps with a first line 24 includes a pair of first portions 246 which is arranged in a spaced-apart manner from each other. Further, a second overlapping portion 238 of the conductive layer 230 which overlaps with a second line 26 includes a pair of second portions 248 which is arranged in a spaced-apart manner from each other. Further, one first portion 246 and one second portion 248 are arranged adjacent to each other, and another first portion 246 and another second portion 248 are arranged adjacent to each other.

A connecting portion 240 includes a first connecting portion 241 which extends between one first portion 246 and one second portion 248 arranged adjacent to each other, a second connecting portion 242 which extends between another first portion 246 and another second portion 248 arranged adjacent to each other, and a third connecting portion 243 which extends between the first connecting portion 241 and the second connecting portion 242 and connects the first connecting portion 241 and the second connecting portion 242 to each other.

The conductive layer 230 is formed into an I shape by one first portion 246 and one second portion 248 arranged adjacent to each other, another first portion 246 and another second portion 248 arranged adjacent to each other, the first connecting portion 241, the second connecting portion 242, and the third connecting portion 243.

The conductive layer 230 is formed in a state where the overlapping of the conductive layer 230 with both the first line 24 and the second line 26 is avoided between the pair of first portions 246 and between the pair of second portions 248. That is, the conductive layer 230 is formed into a shape where the conductive layer 230 has a width thereof narrowed between the pair of first portions 246 and between the pair of second portions 248 thus ensuring spaces adjacent to the narrow-width portion. In the IPS (In Plane Switching) type liquid crystal display device, the common electrode 34 (see FIG. 3) is formed adjacent to the conductive layer 230. According to this embodiment, even when the common electrode 34 is formed such that the common electrode 34 is arranged close to the conductive layer 230, the space can be ensured due to the narrow-width portion thus reducing a possibility that the common electrode 34 and the conductive layer 230 are short-circuited due to a defect in a manufacturing step (such as misalignment of a photo mask or the like). Due to such a constitution, it is possible to increase a size of the pixel electrode 22 and the common electrode 34 thus increasing a numerical aperture of the display device by decreasing a distance between the conductive layer 230 and the common electrode 34.

Further, the conductive layer 230 has the above-mentioned shape and hence, an overlapping area between the first line 24 and the conductive layer 230 and an overlapping area between the second line 26 and the conductive layer 230 can be made smaller than the corresponding overlapping areas in the examples explained in conjunction with FIG. 2 and FIG. 10 and hence, it is possible to reduce a coupling capacitance thus decreasing delay of a signal.

Figure 17:
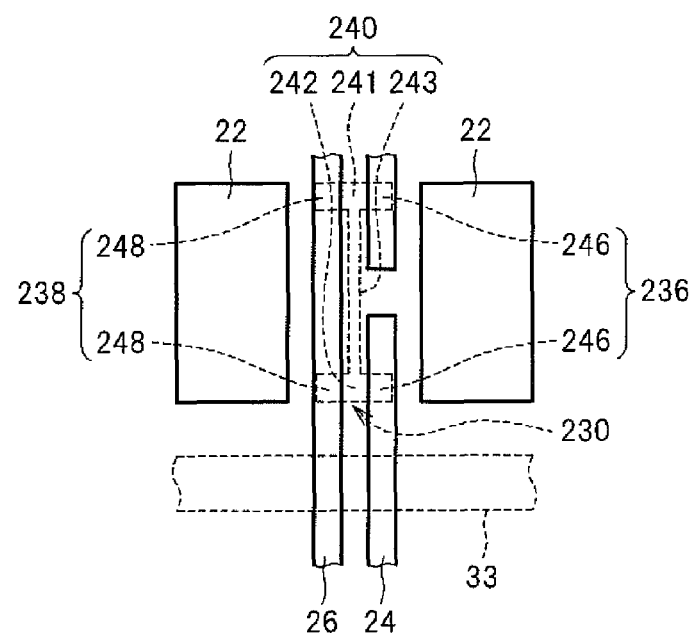
FIG. 17 is a view for explaining a method of repairing the disconnection of a line in the display device according to the third embodiment.
Figure 18:
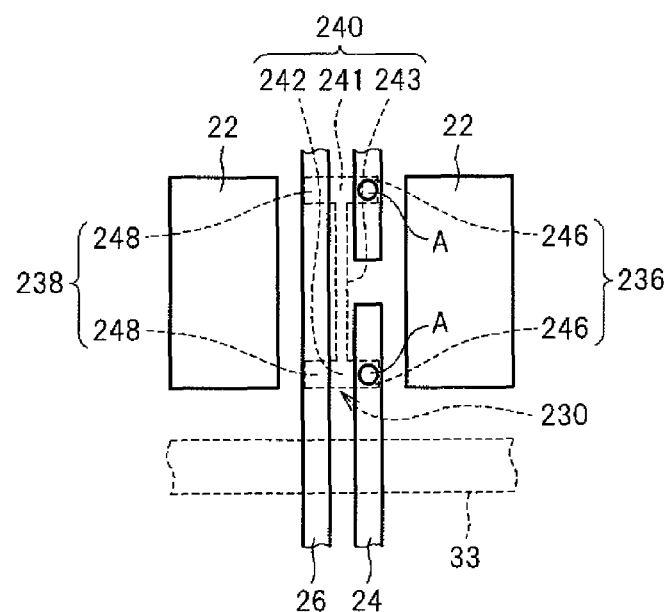
FIG. 18 is a view for explaining the method of repairing the disconnection of the line in the display device according to the third embodiment.

FIG. 17 and FIG. 18 are views for explaining a method of repairing the disconnection of a line in the display device according to the third embodiment.

FIG. 17 shows an example in which the first line 24 is disconnected. For example, such disconnection may occur when etching is defective or when a foreign material which lies on the first line 24 is removed using a laser beam.

In this case, as shown in FIG. 18, with respect to the first line 24, portions A of the first line 24 which sandwich a disconnecting portion therebetween are electrically connected with the pair of first portions 246 of the first overlapping portion 236 of the conductive layer 230 respectively. The detail of the electrical connection is exactly equal to the corresponding electrical connection described above. Due to such electrical connection, it is possible to repair the disconnection of the first line 24. Here, it is also possible to repair the disconnection of the second line 26 in place of the first line 24.

Fourth Embodiment

Figure 19:
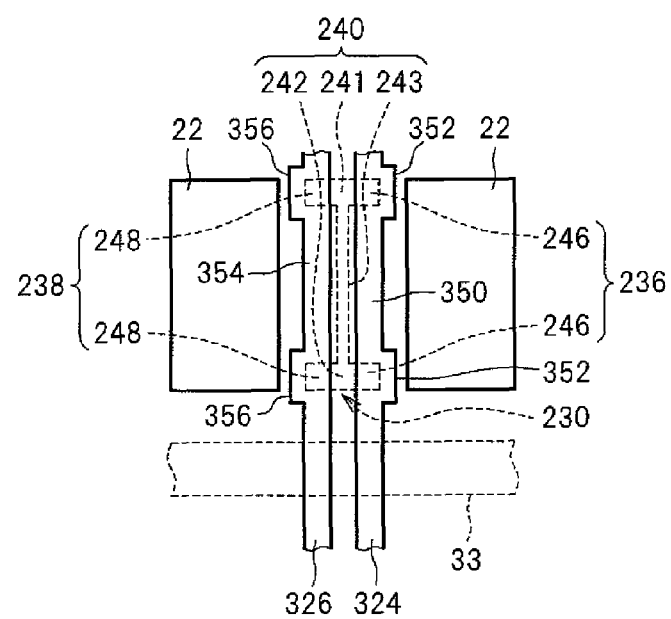
FIG. 19 is a plan view showing a portion of a display device according to a fourth embodiment in an enlarged manner.

FIG. 19 is a plan view showing a portion of a display device according to a fourth embodiment in an enlarged manner. This embodiment differs from the third embodiment with respect to a shape of a first line 324 and a shape of a second line 326, and other constitutions of this embodiment are exactly equal to the corresponding constitutions explained in the third embodiment.

In this embodiment, the first line 324 includes a first side portion 350 which has a side opposite to the second line 326 and extends continuously. The first line 324 also includes a pair of first large-width portions 352 which is formed in a projecting manner in the direction opposite to the second line 326. A pair of first portions 246 of a conductive layer 230 overlaps with portions of a pair of first large-width portions 352 on a second-line-326 side but is arranged in a state where the overlapping of the first portions 246 with the first side portion 350 is avoided.

The second line 326 includes a second side portion 354 which has a side opposite to the first line 324 and extends continuously. The second line 326 also includes a pair of second large-width portions 356 which is formed in a projecting manner in the direction opposite to the first line 324. A pair of second portions 248 of the conductive layer 230 overlaps with portions of a pair of second large-width portions 356 on a first-line-324 side but is arranged in a state where the overlapping of the second portions 248 with the second side portion 354 is avoided.

According to this embodiment, the conductive layer 230 is arranged in a state where the overlapping of the conductive layer 230 with the first side portion 350 and the second side portion 354 is avoided. Accordingly, it is possible to prevent the disconnection which is liable to occur on a portion of the first line 324 or a portion of the second line 326 which stereoscopically intersects with the conductive layer 230 because of a stepped portion formed due to a thickness of the conductive layer 230.

Figure 20:
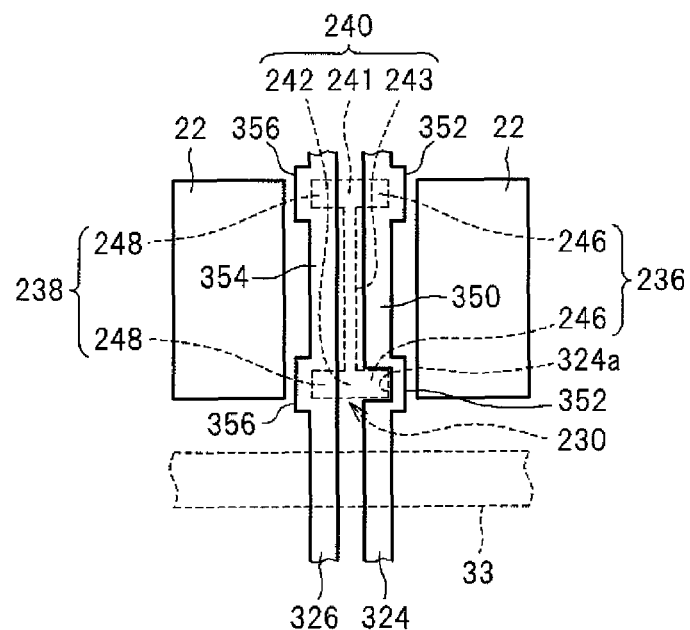
FIG. 20 is a plan view showing the portion of the display device according to the fourth embodiment in an enlarged manner.

For example, as shown in FIG. 20, even when chipping 324a occurs at a portion of the first line 324 which stereoscopically intersects with the conductive layer 230, the first side portion 350 of the first large-width portion 352 is arranged so as to be routed around the portion and hence, the first line 324 is not disconnected. The same goes for the second line 326.

Fifth Embodiment

Figure 21:
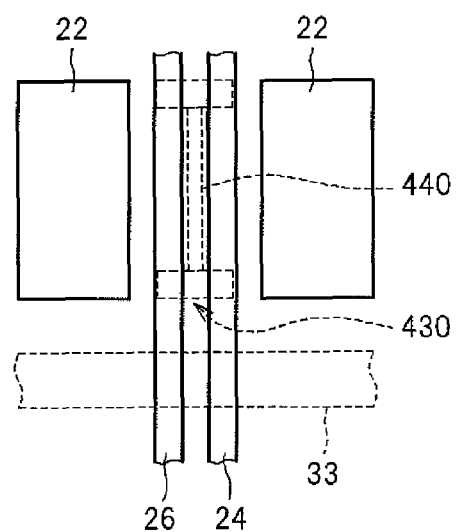
FIG. 21 is a plan view showing a portion of a display device according to a fifth embodiment in an enlarged manner.

FIG. 21 is a plan view showing a portion of a display device according to a fifth embodiment in an enlarged manner. In this embodiment, a third connecting portion 440 is made of a light transmitting material such as ITO (Indium Tin Oxide). Other constitutions of this embodiment are exactly equal to the corresponding constitutions explained in the third embodiment.

Figure 22:
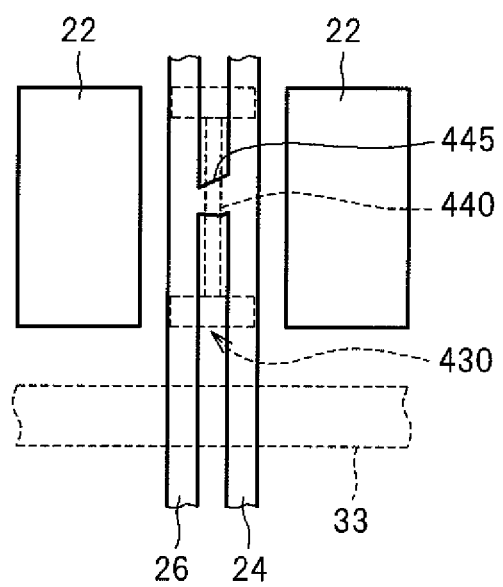
FIG. 22 is a plan view showing the portion of the display device according to the fifth embodiment in an enlarged manner.

According to this embodiment, the third connecting portion 440 of a conductive layer 430 which is arranged between a first line 24 and a second line 26 is made of a light transmitting material. Accordingly, as shown in FIG. 22, even when the first line 24 and the second line 26 are short-circuited due to a defect in etching, a surface of a short-circuited portion 445 and a surface of the third connecting portion 440 differ from each other in light reflectance and hence, it is possible to easily and visually recognize such short-circuiting.

The present invention is not limited to the above-mentioned embodiments and various modifications are conceivable. For example, the constitutions explained in the above-mentioned embodiments can be replaced with the constitution which is substantially equal to the above-mentioned constitutions, the constitution by which the same manner of operation and the same advantageous effect as the above-mentioned embodiments can be obtained, or the constitution which can achieve the same object as the above-mentioned constitutions.

What is claimed is:

1. A display device comprising:
a first line and a second line which are arranged to extend adjacent to and parallel to each other in a spaced-apart manner;
a conductive layer which is arranged at a position where the conductive layer overlaps with the first line and the second line; and
an insulation layer which is interposed between the first and second lines and the conducive layer; wherein
the conductive layer includes a first overlapping portion which overlaps with the first line, a second overlapping portion which overlaps with the second line, and a connecting portion which is arranged between the first overlapping portion and the second overlapping portion and connects the first overlapping portion and the second overlapping portion;
the connecting portion includes a first connecting portion and a second connecting portion which are arranged in a spaced-apart manner from each other; and
the conductive layer includes a slit in a region surrounded by the first overlapping portion, the second overlapping portion, the first connecting portion and the second connecting portion.

2. A display device comprising:
a first line and a second line which are arranged to extend adjacent to and parallel to each other in a spaced-apart manner;
a conductive layer which is arranged at a position where the conductive layer overlaps with the first line and the second line; and
an insulation layer which is interposed between the first and second lines and the conducive layer; wherein
the conductive layer includes a first overlapping portion which overlaps with the first line, a second overlapping portion which overlaps with the second line, and a connecting portion which is arranged between the first overlapping portion and the second overlapping portion and connects the first overlapping portion and the second overlapping portion;
the first overlapping portion includes a pair of first portions which is arranged in a spaced-apart manner from each other;
the second overlapping portion includes a pair of second portions which is arranged in a spaced-apart manner from each other;
the conductive layer is formed in a state where the overlapping of the conductive layer with both of the first line and the second line is avoided between the pair of first portions and between the pair of second portions;
one of the first portions and one of the second portions are arranged adjacent to each other, and the other of the first portions and the other of the second portions are arranged adjacent to each other; and
the connecting portion includes a first connecting portion which extends in a direction of a gap between the one of the first portions and the one of the second portions arranged adjacent to each other, a second connecting portion which extends in a direction of a gap between the other of the first portions and the other of the second portions arranged adjacent to each other, and a third connecting portion which extends in a direction of a gap between the first connecting portion and the second connecting portion.

3. The display device according to claim 2, wherein the first line includes a first side portion which includes a side opposite to the second line and extends continuously,
the second line includes a second side portion which includes a side opposite to the first line and extends continuously,
the pair of first portions is arranged in a state where the overlapping of the first portions with the first side portion is avoided, and
the pair of second portions is arranged in a state where the overlapping of the second portions with the second side portion is avoided.

4. The display device according to claim 3, wherein the first line includes a pair of first large-width portions which is formed in a projecting manner in the direction opposite to the second line,
the second line includes a pair of second large-width portions which is formed in a projecting manner in the direction opposite to the first line,
the pair of first portions overlaps with portions of the pair of first large-width portions on a second line side, and
the pair of second portions overlaps with portions of the pair of second large-width portions on a first line side.

5. The display device according to claim 3, wherein the third connecting portion is made of a light transmitting material.

* * * * *